(12) United States Patent
Huang et al.

(10) Patent No.: US 10,395,612 B2
(45) Date of Patent: Aug. 27, 2019

(54) DRIVER CIRCUIT

(71) Applicant: InnoLux Corporation, Miao-Li County (TW)

(72) Inventors: Sheng-Feng Huang, Miao-Li County (TW); Akihiro Iwatsu, Miao-Li County (TW); Cheng-Min Wu, Miao-Li County (TW); Kuanfeng Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 245 days.

(21) Appl. No.: 15/365,990

(22) Filed: Dec. 1, 2016

(65) Prior Publication Data

US 2017/0162145 A1 Jun. 8, 2017

Related U.S. Application Data

(60) Provisional application No. 62/262,430, filed on Dec. 3, 2015.

(30) Foreign Application Priority Data

Jun. 17, 2016 (TW) .............................. 105119030 A (51) Int. Cl.
*G09G 3/36* (2006.01)
*G02F 1/1368* (2006.01)
*G02F 1/1362* (2006.01)

(52) U.S. Cl.
CPC ......... *G09G 3/3648* (2013.01); *G02F 1/1368* (2013.01); *G02F 1/136286* (2013.01); *G09G 2310/08* (2013.01)

(58) Field of Classification Search
CPC .............. G09G 3/3648; G09G 2310/08; G02F 1/1368; G02F 1/136286
See application file for complete search history.

(56) References Cited

U.S. PATENT DOCUMENTS

| 7,106,292 | B2 | 9/2006 | Moon | |
|---|---|---|---|---|
| 8,330,156 | B2 | 12/2012 | Yamazki et al. | |
| 9,406,400 | B2 | 8/2016 | Kuo et al. | |
| 2011/0222645 | A1 | 9/2011 | Tobita | |
| 2015/0255172 | A1* | 9/2015 | Kuo | G11C 19/287 327/109 |
| 2016/0182042 | A1* | 6/2016 | Kim | G09G 3/3225 345/213 |
| 2017/0116945 | A1* | 4/2017 | Cho | G09G 3/3677 |
| 2017/0193893 | A1* | 7/2017 | Lee | G09G 3/2092 |

FOREIGN PATENT DOCUMENTS

| CN | 101783368 A | 7/2010 |
|---|---|---|
| CN | 103295962 A | 9/2013 |
| TW | 200400516 A | 1/2004 |
| TW | 201535975 A | 9/2015 |

* cited by examiner

*Primary Examiner* — Nelson M Rosario
*Assistant Examiner* — Andrew Lee
(74) *Attorney, Agent, or Firm* — McClure, Qualey & Rodack, LLP (57) ABSTRACT

A driver circuit which includes an output circuit and a control circuit coupled to the output circuit. The driver circuit includes a pull-up transistor with a silicon semiconductor layer. The control circuit includes a first transistor with an oxide semiconductor layer.

12 Claims, 12 Drawing Sheets

DRIVER CIRCUIT

BACKGROUND

1. Field of the Disclosure

The present disclosure relates to the technical field of liquid crystal displays and, more particularly, to a gate line driving circuit.

2. Description of Related Art

Generally, a display panel includes a panel body, a gate driving circuit and a source driving circuit. The source driving circuit is arranged on the panel for driving pixels of the display panel through source lines. The gate driving circuit is arranged on the panel for driving the pixels of the display panel through gate lines. In addition, gate driving circuit includes a shift register. The shift register is used to transmit gate signals to the gate lines that are connected to the shift register, so the gate lines can be enabled sequentially, thereby driving the pixels.

Recently, large-scale panels become popular in displays or televisions. In large-scale panels, the length of gate line increases. This causes the problem of signal decay in a long distance transmission. It is always a challenge to effectively compensate the gate signal for circuit design. Therefore, it is desired for the above display panels to be improved.

SUMMARY

The main propose of the present disclosure is to provide a driver circuit, more particularly, a gate line driving circuit, wherein the pull-up transistor in an output circuit is chosen to be a transistor with a silicon (or polysilicon) semiconductor layer, such as an LTPS transistor. When being turned on, the polysilicon transistor can provide a larger current and has a larger driving capability to drive a gate line.

Moreover, in the control circuit, for a transistor connected to a first control node, the transistor is chosen to be a transistor with an oxide semiconductor layer, such as an IGZO transistor, for providing a lower leakage current. It can eliminate the voltage variation at the control end of the pull-up transistor, thereby enabling the pull-up transistor to provide a stable driving current to the gate line, and thus mitigating the problem of signal decay in a long distance transmission in prior art.

The stack-up structure of the transistors with commonly-shared gate of the present disclosure can effectively save the area of circuit layout. Moreover, the channels of the transistors with commonly-shared gate are arranged in the same direction. Therefore, it is able to adjust the width to length ratio (W/L) of transistor, without disturbing the circuit layout of another transistor, thereby improving the convenience for circuit layout.

To achieve the aforementioned object, there is provided a driver circuit which includes an output circuit and a control circuit coupled to the output circuit. The driver circuit includes a pull-up transistor with a silicon (or polysilicon) semiconductor layer. The control circuit includes a first transistor with an oxide semiconductor layer.

Further, there is also provided a display including the aforementioned driver circuit.

DETAILED DESCRIPTION

Figure 1:
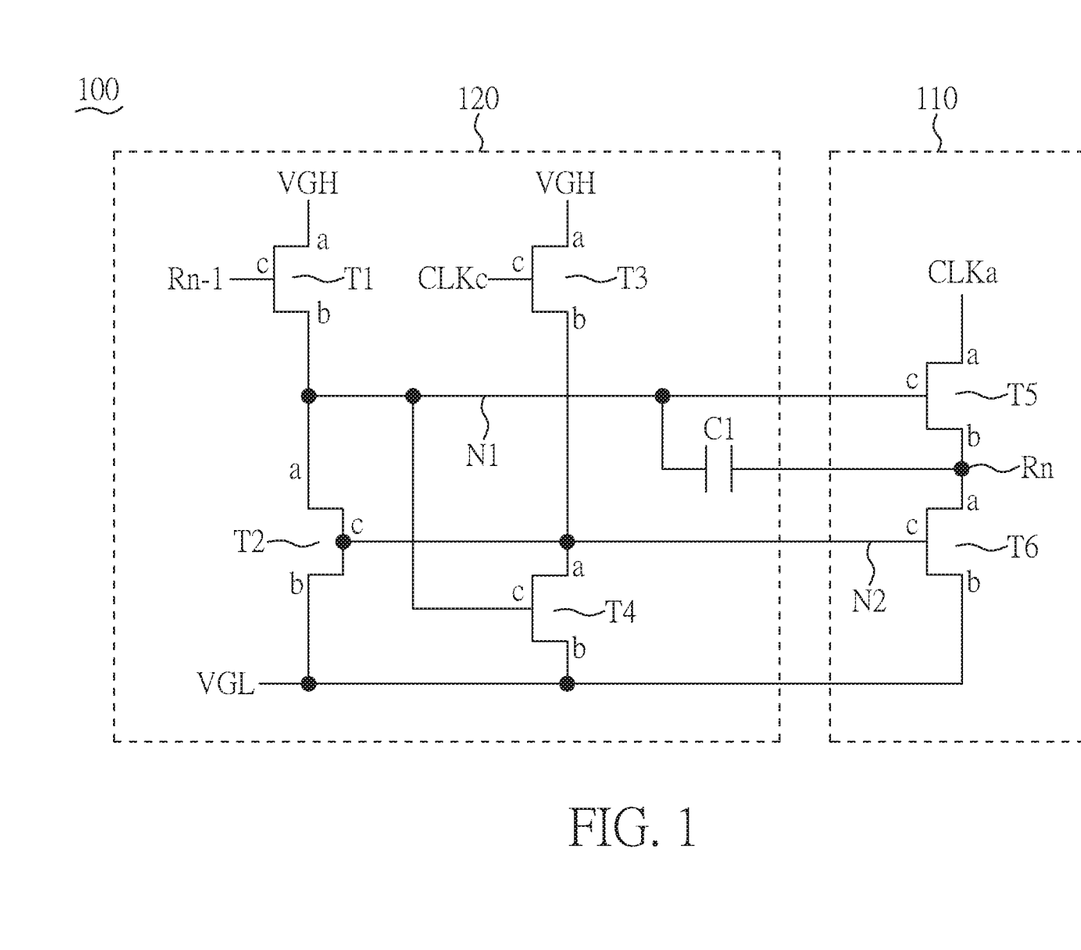
FIG. 1 is a circuit diagram of a gate line driving circuit according to the present disclosure.

FIG. 1 is a circuit diagram of a gate line driving circuit 100 according to the present disclosure. As shown in FIG. 1, the driving circuit 100 includes an output circuit 110, and a control circuit 120, which is used to drive a gate line (Rn). The output circuit 110 includes a pull-up transistor (T5) and an auxiliary transistor (T6). The pull-up transistor (T5) and the auxiliary transistor (T6) have a first control node (N1) and a second control node (N2), respectively. The control circuit 120 is coupled to the output circuit 110. The control circuit 120 has a plurality of transistors (T1, T2, T3, T4). The transistors (T1, T2, T3, T4) are connected to the first control node (N1) and the second control node (N2) for controlling the pull-up transistor (T5) and the auxiliary transistor (T6) to be turned on or off. At least one of the transistors (T1, T2, T3, T4) is a transistor with an oxide semiconductor layer, such as an indium-gallium-zinc oxide (IGZO) transistor.

As shown in FIG. 1, the control circuit 120 includes a first capacitor (C1), a first transistor (T1), a second transistor (T2), a third transistor (T3) and a fourth transistor (T4). The pull-up transistor (T5) is coupled to a first clock signal (CLKa), a gate line (Rn), the first capacitor (C1), the first control node (N1) and the first capacitor (C1). The auxiliary transistor (T6) is coupled to the pull-up transistor (T5), a low voltage (VGL) and the second control node (N2). The first transistor (T1) is coupled to a high voltage (VGH), the first control node (N1) and a previous gate line (Rn–1). The second transistor (T2) is coupled to the first control node (N1), the low voltage (VGL) and the second control node (N2). The third transistor (T3) is coupled to the high voltage (VGH), the second control node (N2) and a second clock signal (CLKc). The fourth transistor (T4) is coupled to the second control node (N2), the low voltage (VGL) and the first control node (N1).

In particular, the pull-up transistor (T5) has a first end (a) connected to a first clock signal (CLKa), a second end (b) connected to the gate line (Rn) and one end of the first capacitor (C1), and a third end (c) coupled to the first control node (N1) and the other end of the first capacitor (C1).

The auxiliary transistor (T6) has a first end (a) connected to the second end (b) of the pull-up transistor (T5), a second end (b) connected to a low voltage (VGL), and a third end (c) coupled to the second control node (N2).

The first transistor (T1) has a first end (a) connected to a high voltage (VGH), a second end (b) connected to the first control node (N1), and a third end (c) connected to a previous gate line (Rn−1).

The second transistor (T2) has a first end (a) connected to the first control node (N1), a second end (b) connected to the low voltage (VGL), and a third end (c) connected to the second control node (N2).

The third transistor (T3) has a first end (a) connected to the high voltage (VGH), a second end (b) connected to the second control node (N2), and a third end (c) connected to a second clock signal (CLKc).

The fourth transistor (T4) has a first end (a) connected to the second control node (N2), a second end (b) connected to the low voltage (VGL), and a third end (c) connected to the first control node (N1).

Figure 2:
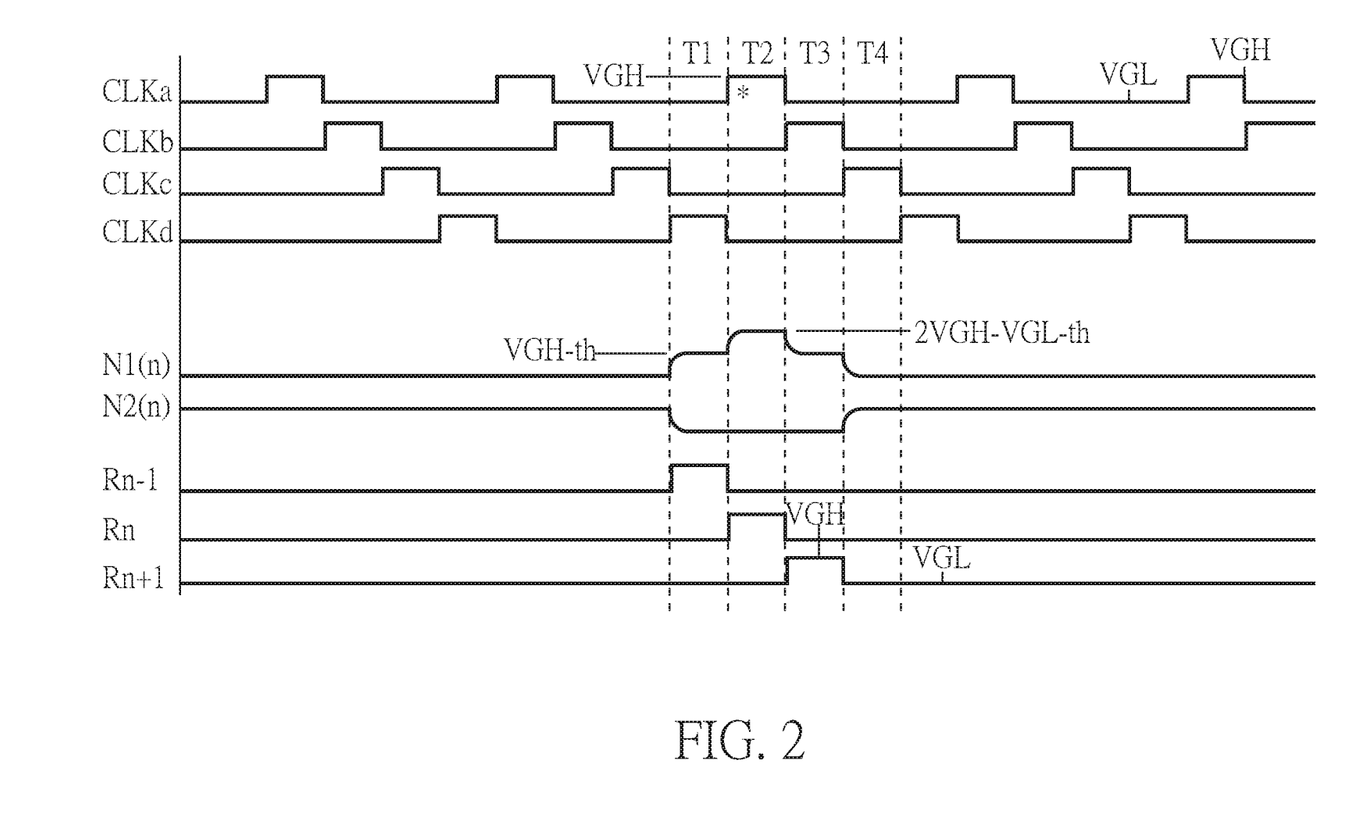
FIG. 2 is a timing diagram of the gate line driving circuit according to the present disclosure.

FIG. 2 is a timing diagram of the gate line driving circuit 100 according to the present disclosure. As shown in FIG. 2, the pulse of the first clock signal (CLKa) is non-overlapped with the pulse of a third clock signal (CLKb), the pulse of the third clock signal (CLKb) is non-overlapped with the pulse of the second clock signal (CLKc), and the pulse of the second clock signal (CLKc) is non-overlapped with the pulse of a fourth clock signal (CLKd).

In the first time period (T1), the signal of the previous gate line (Rn−1) is at high voltage. Therefore, the first transistor (T1) is turned on, so that the first control node (N1) becomes high voltage. The first control node (N1) is at high voltage, so that the pull-up transistor (T5) is turned on, and thus the high voltage (VGH) charges the first capacitor (C1) through the first transistor (T1). At the same time, the first control node (N1) is at high voltage, so that the fourth transistor (T4) is turned on, resulting in that the second control node (N2) becomes the low voltage (VGL), and thus the second transistor (T2) and the auxiliary transistor (T6) are turned off.

In the second time period (T2), the first clock signal (CLKa) provides pulses. Since the pull-up transistor (T5) is turned on, the voltage of the second end (b) of the pull-up transistor (T5) is at the high voltage (VGH). This boosts up the voltage of the first control node (N1) to 2VGH-VGL-vth, so that the pull-up transistor (T5) is fully turned on, by which the driving capability for the gate line (Rn) is improved. At this moment, the voltage of the gate line (Rn) is at the high voltage (VGH).

In the third time period (T3), the pulse provided by the first clock signal (CLKa) disappears, so that the voltage of the first control node (N1) returns to VGH-vth. At the same time, the gate line (Rn) returns to the low voltage (VGL) as well. At this moment, the fourth transistor (T4) is turned on, the second transistor (T2) and the auxiliary transistor (T6) are turned off, and the second control node (N2) is at the low voltage.

In the fourth time period (T4), the second clock signal (CLKc) provides pulses, so that the third transistor (T3) is turned on, Therefore, the second control node (N2) at the low voltage is pulled up to be at the high voltage (VGH), resulting in that the second transistor (T2) is turned on, and the voltage of the first control node (N1) decreases to the low voltage (VGL).

Figure 3:
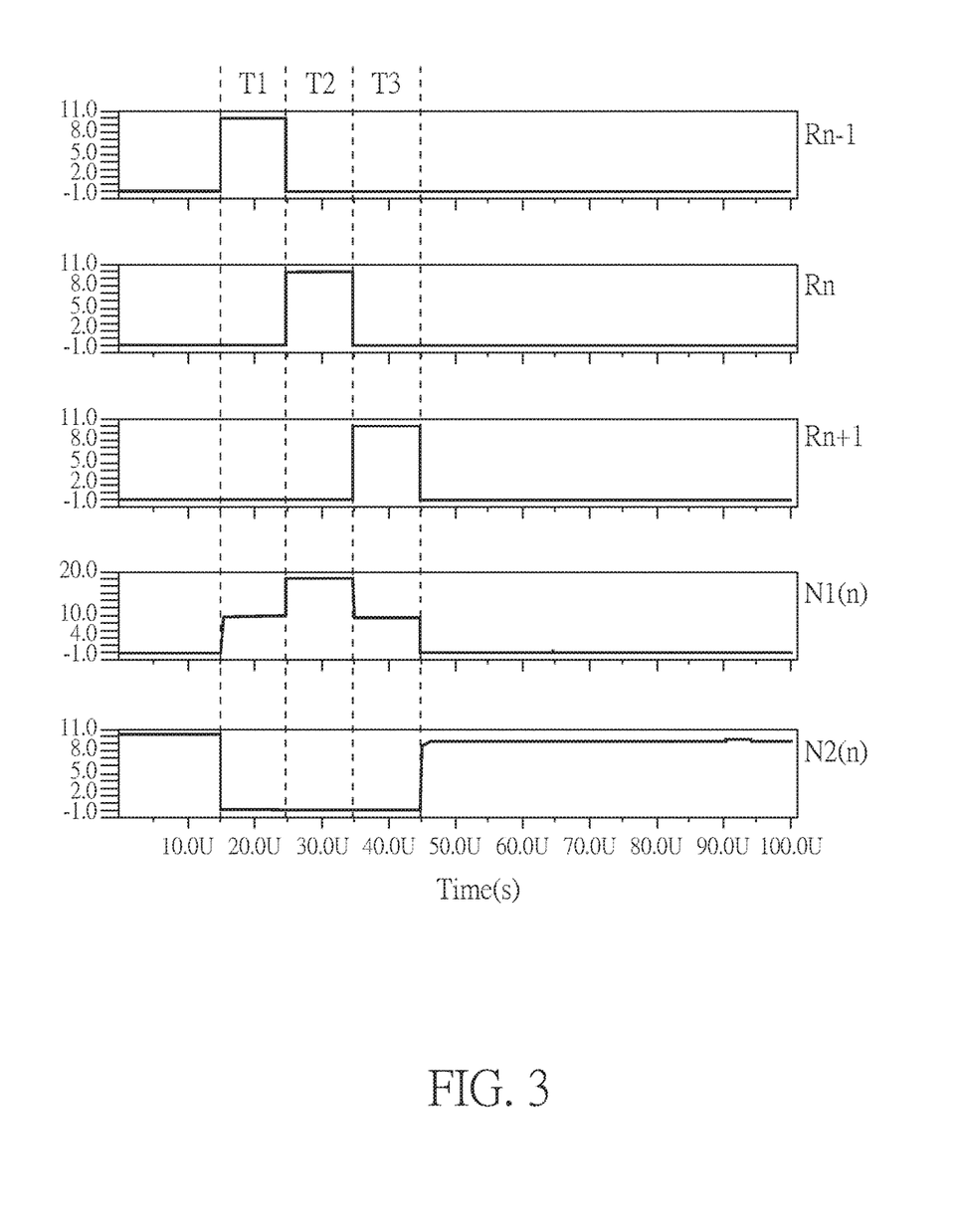
FIG. 3 is a simulation timing diagram of the gate line driving circuit according to the present disclosure.

FIG. 3 is a simulation timing diagram of the gate line driving circuit 100 according to the present disclosure. As shown in FIG. 3, in the second time period (T2), the voltage of the first control node (N1) is boosted to about 18 volts, so that the pull-up transistor (T5) is fully turned on. Therefore, it can improve the driving capability for the gate line (Rn).

Figure 4:
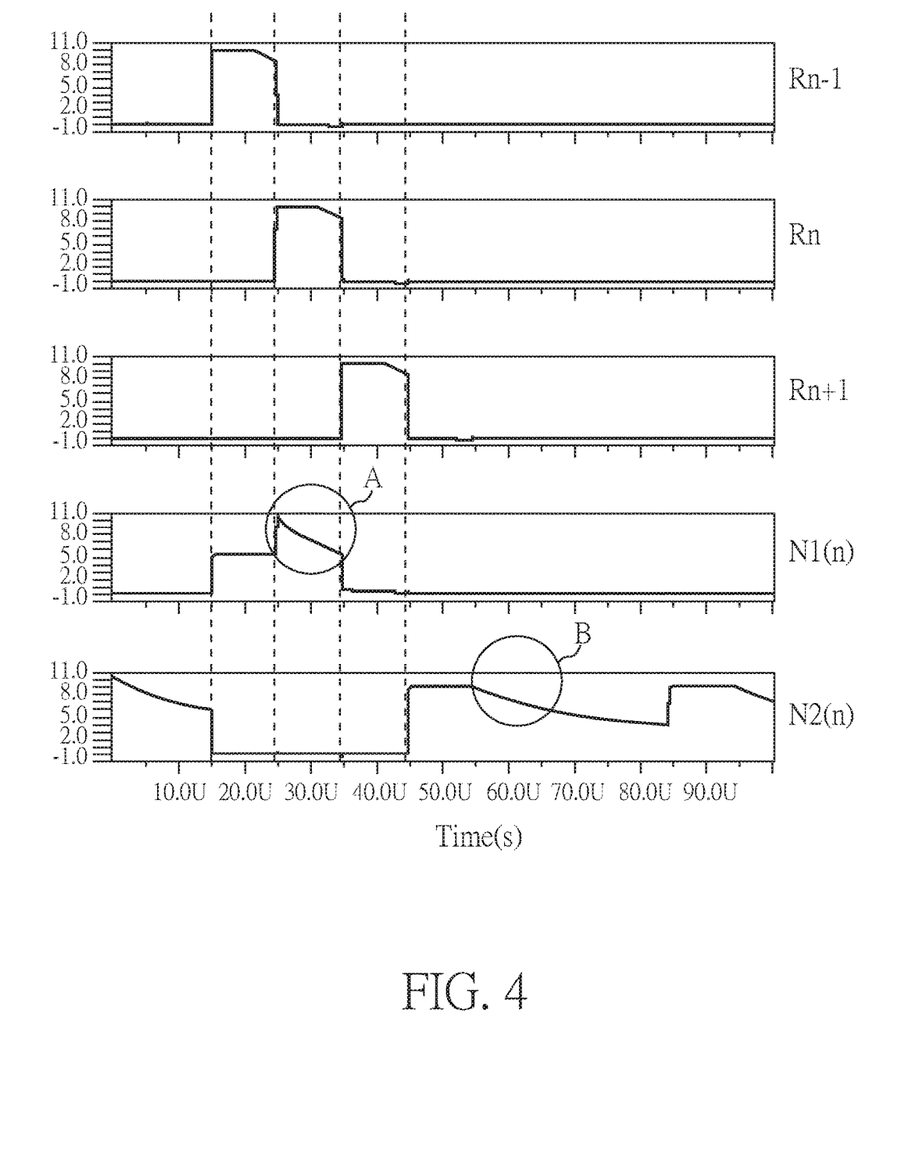
FIG. 4 is another simulation timing diagram of the gate line driving circuit according to the present disclosure.

FIG. 4 is another simulation timing diagram of the gate line driving circuit 100 according to the present disclosure. It is a simulation timing diagram where the transistors (T1, T2, T3, T4) are set to have leakage current. By setting leakage current, the simulation timing diagram can further approach the real condition of the circuit. As shown in FIG. 4, since the transistors (T1, T2, T3, T4) have leakage current, as shown by the circle A, the voltage of the first control node (N1) is boosted to 18 volts, and soon it begins to decrease. At the end of the second time period (T2), it even decreases to about 10 volts. That is, in the second time period (T2), the pull-up transistor (T5) is not fully turned on, and it degrades the driving capability for the gate line (Rn).

Figure 5:
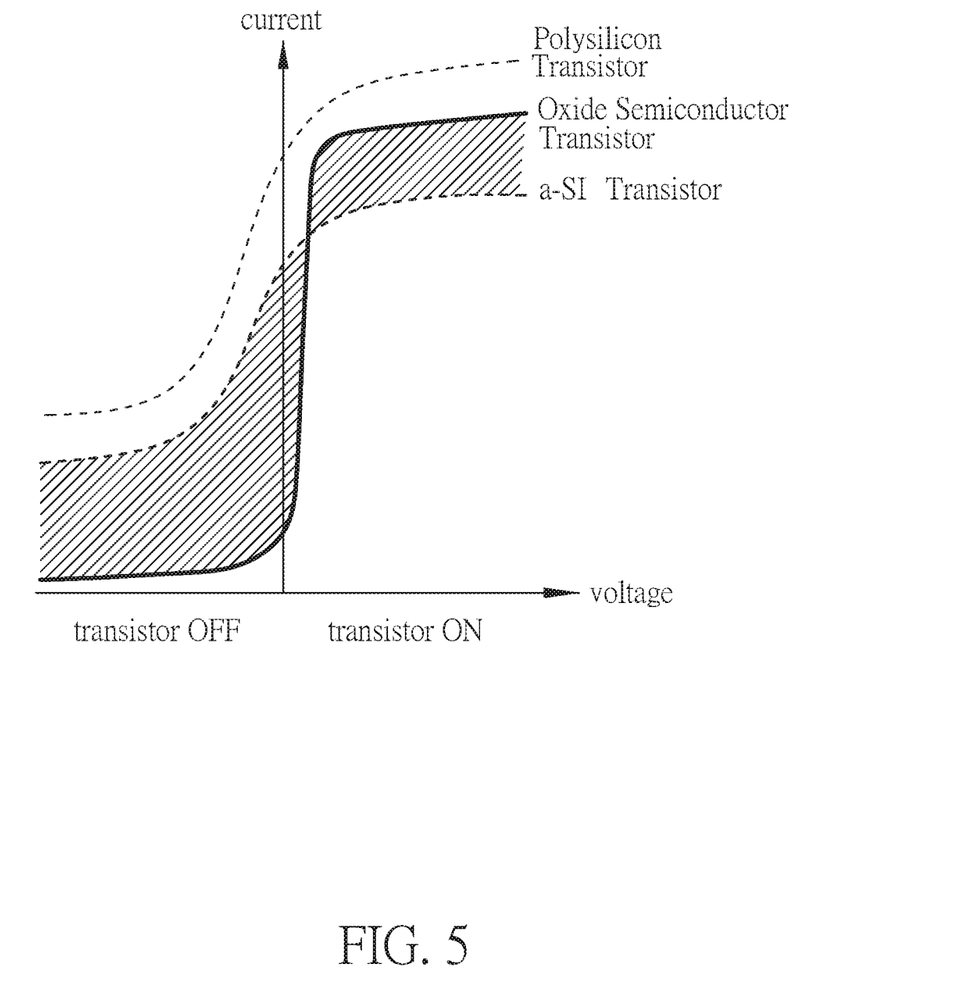
FIG. 5 is a turn-on and turn-off currents diagram for a polysilicon transistor, an oxide semiconductor transistor, and an amorphous silicon transistor.

FIG. 5 is a turn-on and turn-off currents diagram for a polysilicon transistor, an oxide semiconductor transistor, and an amorphous silicon transistor. As shown in FIG. 5, when turning on, a polysilicon transistor has larger current, and when turning off, an oxide semiconductor transistor has smaller leakage current than a polysilicon transistor and an amorphous silicon (a-Si) transistor do.

Therefore, for the problem shown in FIG. 4, at least one of the first transistor (T1), the second transistor (T2) and the fourth transistor (T4) of the present disclosure is an oxide semiconductor transistor, in order to reduce leakage current, to avoid the voltage decrease at the first control node (N1) due to the leakage current. The pull-up transistor (T5) is a transistor with a silicon (or polysilicon) semiconductor layer, such as a low temperature polysilicon (LTPS) transistor, to provide larger current when conducting, to drive the gate line (Rn).

Figure 6:
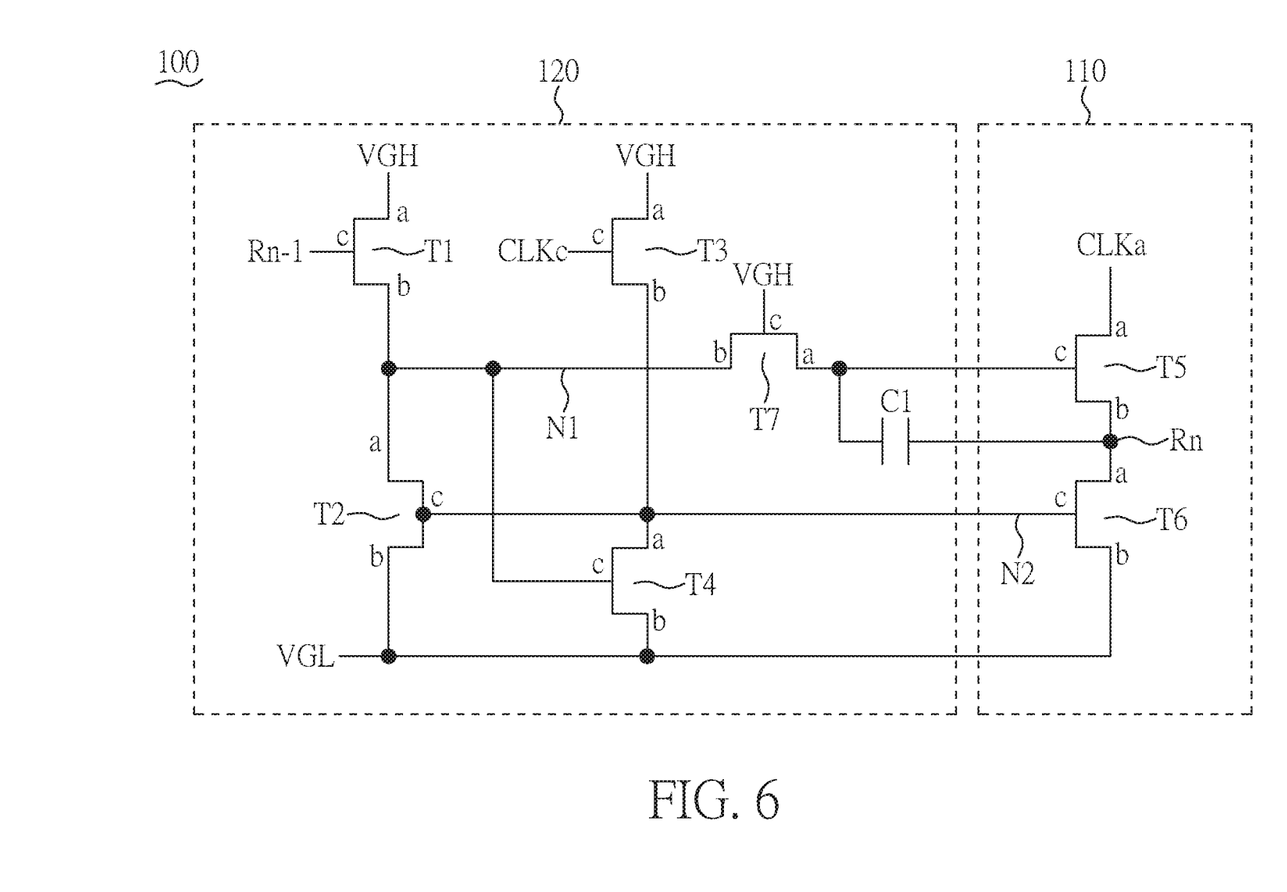
FIG. 6 is another circuit diagram of a gate line driving circuit according to the present disclosure.

FIG. 6 is another circuit diagram of a gate line driving circuit 100 according to the present disclosure. This embodiment is similar to FIG. 1 except that in FIG. 6, a fifth transistor (T7) is added. The fifth transistor (T7) is coupled to the first control node (N1), the high voltage (VGH) and the first transistor (T1).

In particular, the fifth transistor (T7) has a first end (a) coupled to the third end (c) of the pull-up transistor (T5); a second end (b) connected to the first control node (N1); a third end (c) connected to the high voltage (VGH).

The timing diagram and the operation of the gate line driving circuit 100 in FIG. 6 are similar to those in FIG. 2, which can be understood by one skilled in the art with the present disclosure, and thus a detailed description therefor is deemed unnecessary.

In one embodiment, at least one of the first transistor (T1), the second transistor (T2) and the fourth transistor (T4) in FIG. 1 and FIG. 6 is an oxide semiconductor transistor. The third transistor (T3), the pull-up transistor (T5) and the auxiliary transistor (T6) in FIG. 1 and FIG. 6, and the fifth transistor (T7) in FIG. 6 are polysilicon transistors.

In another embodiment, at least one of the first transistor (T1), the second transistor (T2) and the fourth transistor (T4) in FIG. 1 and FIG. 6 is an oxide semiconductor transistor. The pull-up transistor (T5) in FIG. 1 and FIG. 6 are polysilicon transistors. The third transistor (T3) and the auxiliary transistor (T6) in FIG. 1 and FIG. 6 and the fifth transistor (T7) and FIG. 6 can be polysilicon transistors or oxide semiconductor transistors.

In still another embodiment, the fourth transistor (T4) in FIG. 1 and FIG. 6 is an oxide semiconductor transistor. The pull-up transistor (T5) in FIG. 1 and FIG. 6 is a polysilicon transistor. The first transistor (T1), the second transistor (T2), the third transistor (T3) and the auxiliary transistor (T6) in FIG. 1 and FIG. 6 and the fifth transistor (T7) in FIG. 6 can be polysilicon transistors or oxide semiconductor transistors.

Figure 7:
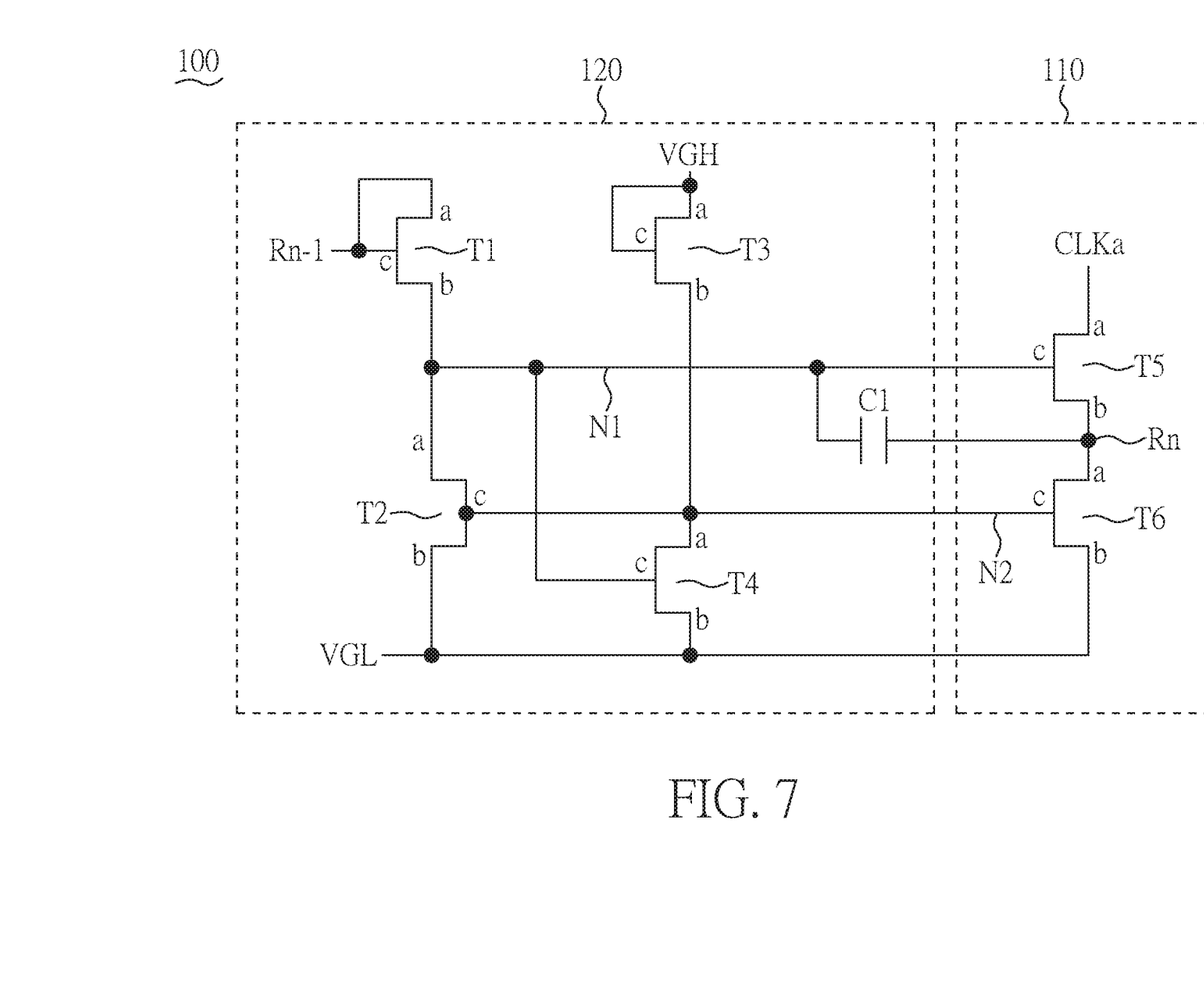
FIG. 7 is still another circuit diagram of a gate line driving circuit of the present disclosure.

FIG. 7 is still another circuit diagram of a gate line driving circuit 100 according to the present disclosure. The control circuit 120 includes a first capacitor (C1), a first transistor (T1), a second transistor (T2), a third transistor (T3) and a fourth transistor (T4). The pull-up transistor (T5) is coupled to a first clock signal (CLKa), a gate line (Rn), the first capacitor (C1), and the first control node (N1). The auxiliary transistor (T6) is coupled to the pull-up transistor (T5), a low voltage (VGL) and the second control node (N2). The first transistor (T1) is coupled to the first control node (N1) and a previous gate line (Rn−1). The second transistor (T2) is coupled to the first control node (N1), the low voltage (VGL) and the second control node (N2). The third transistor (T3) is coupled to the high voltage (VGH) and the second control node (N2). The fourth transistor (T4) is coupled to the second control node (N2), the low voltage (VGL) and the first control node (N1).

The circuit in FIG. 7 is similar to that in FIG. 1 except that the first transistor (T1) is diode-connected, where a first end (a) and a third end (c) thereof are connected to the gate line (Rn). The third transistor (T3) is coupled to the high voltage (VGH) and the second control node (N2).

The third transistor (T3) has a first end (a) connected to the high voltage (VGH) and the third end (c) thereof, and a second end (b) connected to the second control node (N2). The timing diagram and the operation of the gate line driving circuit 100 in FIG. 7 are similar to those in FIG. 2, which can be understood by one skilled in the art with the present disclosure, and thus a detailed description therefor is deemed unnecessary.

In one embodiment, at least one of the first transistor (T1) and the second transistor (T2) in FIG. 7 is an oxide semiconductor transistor; the third transistor (T3), the fourth transistor (T4), the pull-up transistor (T5) and the auxiliary transistor (T6) in FIG. 7 are polysilicon transistors.

In another embodiment, at least one of the first transistor (T1) and the second transistor (T2) in FIG. 7 is an oxide semiconductor transistor; the pull-up transistor (T5) in FIG. 7 is a polysilicon transistor. The third transistor (T3), the fourth transistor (T4) and the auxiliary transistor (T6) in FIG. 7 can be polysilicon transistors or oxide semiconductor transistors.

Figure 8:
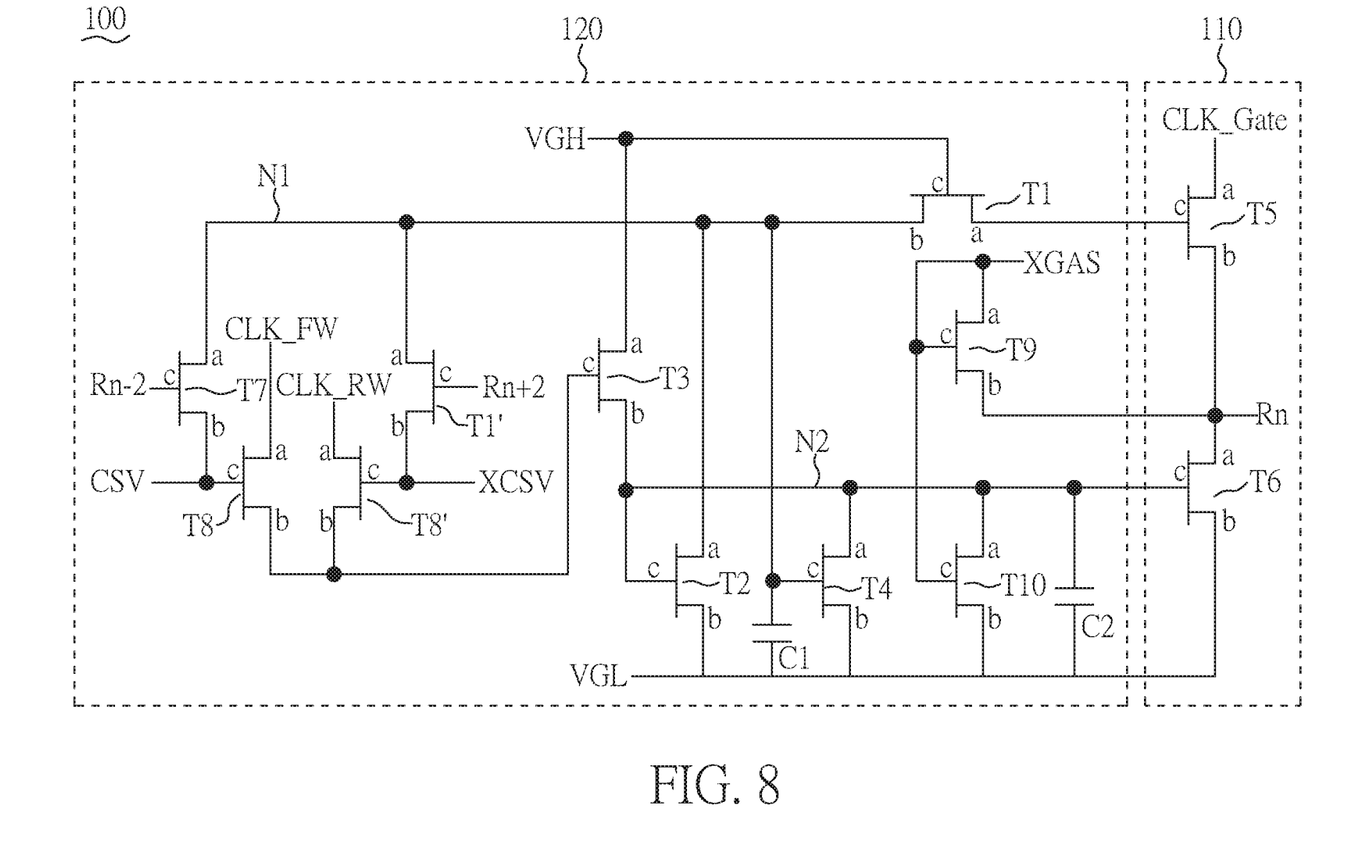
FIG. 8 is yet another circuit diagram of a gate line driving circuit according to the present disclosure.

FIG. 8 is yet another circuit diagram of a gate line driving circuit 100 according to the present disclosure, wherein the output circuit 110 is similar to FIG. 1, and thus a detailed description therefor is deemed unnecessary.

The control circuit 120 further includes a first capacitor (C1), a second capacitor (C2), a first transistor (T1), a second transistor (T2), a third transistor (T3), a fourth transistor (T4), a fifth transistor (T9), a sixth transistor (T10), a seventh transistor (T7), an eighth transistor (T8), a ninth transistor (T1') and a tenth transistor (T8').

The pull-up transistor (T5) is coupled to a first clock signal (CLK_Gate), a gate line (Rn), the auxiliary transistor (T6), the fifth transistor (T9), and the first transistor (T1).

The auxiliary transistor (T6) is coupled to a low voltage (VGL), the second control node (N2), the third transistor (T3), the second transistor (T2), the fourth transistor (T4), the sixth transistor (T10) and the second capacitor (C2).

The sixth transistor (T10) is coupled to the low voltage (VGL), the fifth transistor (T9) and a first control signal line (XGAS).

The fourth transistor (T4) is coupled to the low voltage (VGL), the first control node (N1), the first transistor (T1), the second transistor (T2), the seventh transistor (T7), the ninth transistor (T1') and the first capacitor (C1).

The first transistor (T1) is coupled to a high voltage (VGH).

The third transistor (T3) is coupled to the high voltage (VGH), the eighth transistor (T8) and the tenth transistor (T8').

The seventh transistor (T7) is coupled to a first input signal (Rn−2), a second control signal line (CVS) and the eighth transistor.

The ninth transistor (T1') is coupled to a second input signal (Rn+2), a third control signal (XCVS) and the tenth transistor (T8').

The eighth transistor (T8) is coupled to a fourth control signal (CLK_FW).

The tenth transistor (T8') is coupled to a fifth control signal (CLK_RW).

In particular, the pull-up transistor (T5) has a first end (a) connected to a first clock signal (CLK_Gate); a second end (b) connected to a gate line (Rn), a first end (a) of the auxiliary transistor (T6) and a second end (b) of the fifth transistor (T9); and a third end (c) connected to a first end (a) of the first transistor (T1).

The auxiliary transistor (T6) has a second end (b) connected to a low voltage (VGL); and a third end (c) connected to the second control node (N2), a second end (b) of the third transistor (T3), a third end (c) of the second transistor (T2), a first end (a) of the fourth transistor (T4), a first end (a) of the sixth transistor (T10) and one end of the second capacitor (C2). The other end of the second capacitor (C2) is connected to the low voltage (VGL).

The sixth transistor (T10) has a second end (b) connected to the low voltage (VGL); and a third end (c) connected to a third end (c) of the fifth transistor (T9), a first end (a) of the fifth transistor (T9) and a first control signal line (XGAS).

The fourth transistor (T4) has a second end (b) connected to the low voltage (VGL); and a third end (c) connected to the first control node (N1), a second end (b) of the first transistor (T1), a first end (a) of the second transistor (T2), a first end (a) of the seventh transistor (T7), a first end (a) of the ninth transistor (T1') and one end of the first capacitor (C1). The other end of the first capacitor (C1) is connected to the low voltage (VGL).

A third end (c) of the first transistor (T1) is connected to a high voltage (VGH). The third transistor (T3) has a first end (a) connected to a high voltage (VGH); and a third end (c) connected to a second end (b) of the eighth transistor (T8) and a second end (b) of the tenth transistor (T8').

The seventh transistor (T7) has a third end (c) connected to a first input signal line (Rn−2); and a second end (b) connected to a second control signal line (CVS) and a third end (c) of the eighth transistor (T8).

The ninth transistor (T1') has a third end (c) connected to a second input signal (Rn+2); and a second end (b) connected to a third control signal (XCVS) and a third end (c) of the tenth transistor (T8').

A first end (a) of the eighth transistor (T8) is connected to a fourth control signal (CLK_FW). A first end (a) of the tenth transistor (T8') is connected to a fifth control signal (CLK_RW).

The timing diagram and the operation of the gate line driving circuit 100 in FIG. 8 are similar to those in FIG. 2, which can be understood by one skilled in the art with the present disclosure, and thus a detailed description therefor is deemed unnecessary.

In one embodiment, at least one of the first transistor (T1), the ninth transistor (T1'), the second transistor (T2) and the fourth transistor (T4) in FIG. 8 is an oxide semiconductor transistor.

In another embodiment, at least one of the first transistor (T1), the ninth transistor (T1'), the second transistor (T2) and the fourth transistor (T4) in FIG. 8 is an oxide semiconductor transistor; the pull-up transistor (T5) in FIG. 8 is a polysilicon transistor. The other transistors in FIG. 8 can be polysilicon transistors or oxide semiconductor transistors.

Figure 9:
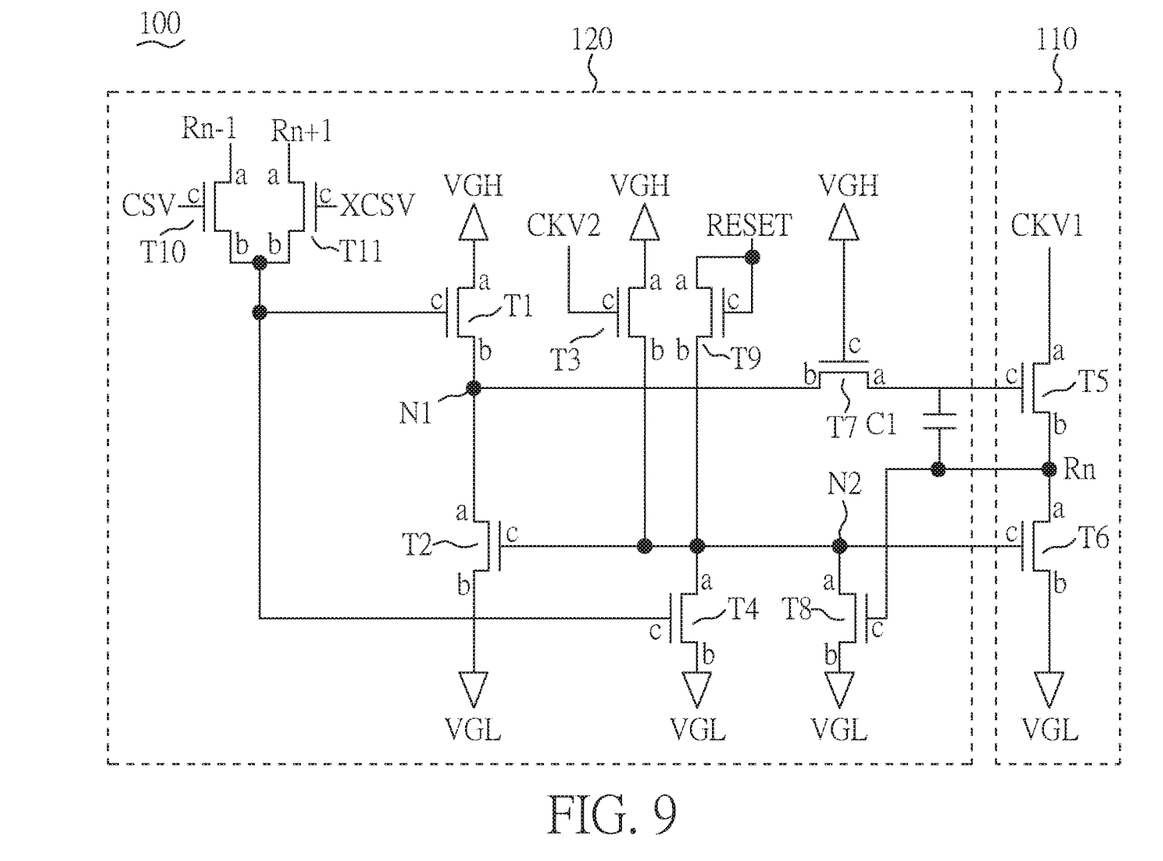
FIG. 9 is a further circuit diagram of a gate line driving circuit according to the present disclosure.

FIG. 9 is a further circuit diagram of a gate line driving circuit 100 of the present disclosure, in which the output circuit 110 is similar to FIG. 1, and thus a detailed description therefor is deemed unnecessary.

The control circuit 120 further includes a first capacitor (C1), a first transistor (T1), a second transistor (T2), a third transistor (T3), a fourth transistor (T4), a fifth transistor (T10), a sixth transistor (T11), a seventh transistor (T7), an eighth transistor (T8) and a ninth transistor (T9).

The pull-up transistor (T5) is coupled to a first clock signal (CKV1), a gate line (Rn), the auxiliary transistor (T6), the eighth transistor, the first capacitor (C1) and the seventh transistor (T7).

The auxiliary transistor (T6) is coupled to a low voltage (VGL), the third transistor (T3), the second transistor (T2), the fourth transistor (T4), the eighth transistor (T8) and the ninth transistor (T9).

The eighth transistor (T8) is coupled to the low voltage (VGL).

The fourth transistor (T4) is coupled to the low voltage (VGL), the fifth transistor (T10), the sixth transistor (T11) and the first transistor (T1).

The second transistor (T2) is coupled to the low voltage (VGL), the first control node (N1), the first transistor (T1), and the seventh transistor (T7).

The seventh transistor (T7) is coupled to a high voltage (VGH).

The third transistor (T3) is coupled to a second control signal (CKV2) and the high voltage (VGH).

The ninth transistor (T9) is coupled to a reset signal (RESET).

The first transistor (T1) is coupled to the high voltage (VGH).

The fifth transistor (T10) is coupled to a third control signal (CSV) and a previous gate line (Rn−1).

The sixth transistor (T11) is coupled to a fourth control signal (XCSV) and a next gate line (Rn+1).

In particular, as shown in FIG. 9, the pull-up transistor (T5) has a first end (a) connected to a first clock signal (CKV1); a second end (b) connected to a gate line (Rn), a first end (a) of the auxiliary transistor (T6), a third end (c) of the eighth transistor (T8) and one end of the first capacitor (C1); and a third end (c) connected to the other end of the first capacitor (C1) and a first end (a) of the seventh transistor (T7).

The auxiliary transistor (T6) has a second end (b) connected to a low voltage (VGL); and a third end (c) connected to a second control node (N2), a second end (b) of the third transistor (T3), a third end (c) of the second transistor (T2), a first end (a) of the fourth transistor (T4), a first end (a) of the eighth transistor (T8) and a second end (b) of the ninth transistor (T9). A second end (b) of the eighth transistor (T8) is connected to the low voltage (VGL).

The fourth transistor (T4) has a second end (b) connected to the low voltage (VGL); and a third end (c) connected to a second end (b) of the fifth transistor (T10), a second end (b) of the sixth transistor (T11) and a third end (c) of the first transistor (T1).

The second transistor (T2) has a second end (b) connected to the low voltage (VGL); and a first end (a) connected to the first control node (N1), a second end (b) of the first transistor (T1), and a second end (b) of the seventh transistor (T7). A third end (c) of the seventh transistor (T7) is connected to a high voltage (VGH).

The third transistor (T3) has a third end (c) connected to a second control signal (CKV2); and a first end (a) connected to the high voltage (VGH). A third end (c) of the ninth transistor (T9) is connected to a first end (a) of the ninth transistor (T9) and a reset signal (RESET). A first end (a) of the first transistor (T1) is connected to the high voltage (VGH).

The fifth transistor (T10) has a third end (c) connected to a third control signal (CSV); and a first end (a) connected to a previous gate line (Rn−1).

The sixth transistor (T11) has a third end (c) connected to a fourth control signal (XCSV); and a first end (a) connected to a next gate line (Rn+1). In the circuit, at least one of the first transistor (T1), the second transistor (T2) and the fourth transistor (T4) is an oxide semiconductor transistor.

In one embodiment, at least one of the first transistor (T1), the second transistor (T2) and the fourth transistor (T4) in FIG. 9 is an oxide semiconductor transistor.

In another embodiment, at least one of the first transistor (T1), the second transistor (T2) and the fourth transistor (T4) in FIG. 9 is an oxide semiconductor transistor. The pull-up transistor (T5) in FIG. 9 is a polysilicon transistor. The other transistors in FIG. 9 can be polysilicon transistors or oxide semiconductor transistors. For example, the fifth transistor (T10), the sixth transistor (T11), the seventh transistor (T7), the eighth transistor (T8) and ninth transistor (T9) can be polysilicon transistors or oxide semiconductor transistors.

Figure 10:
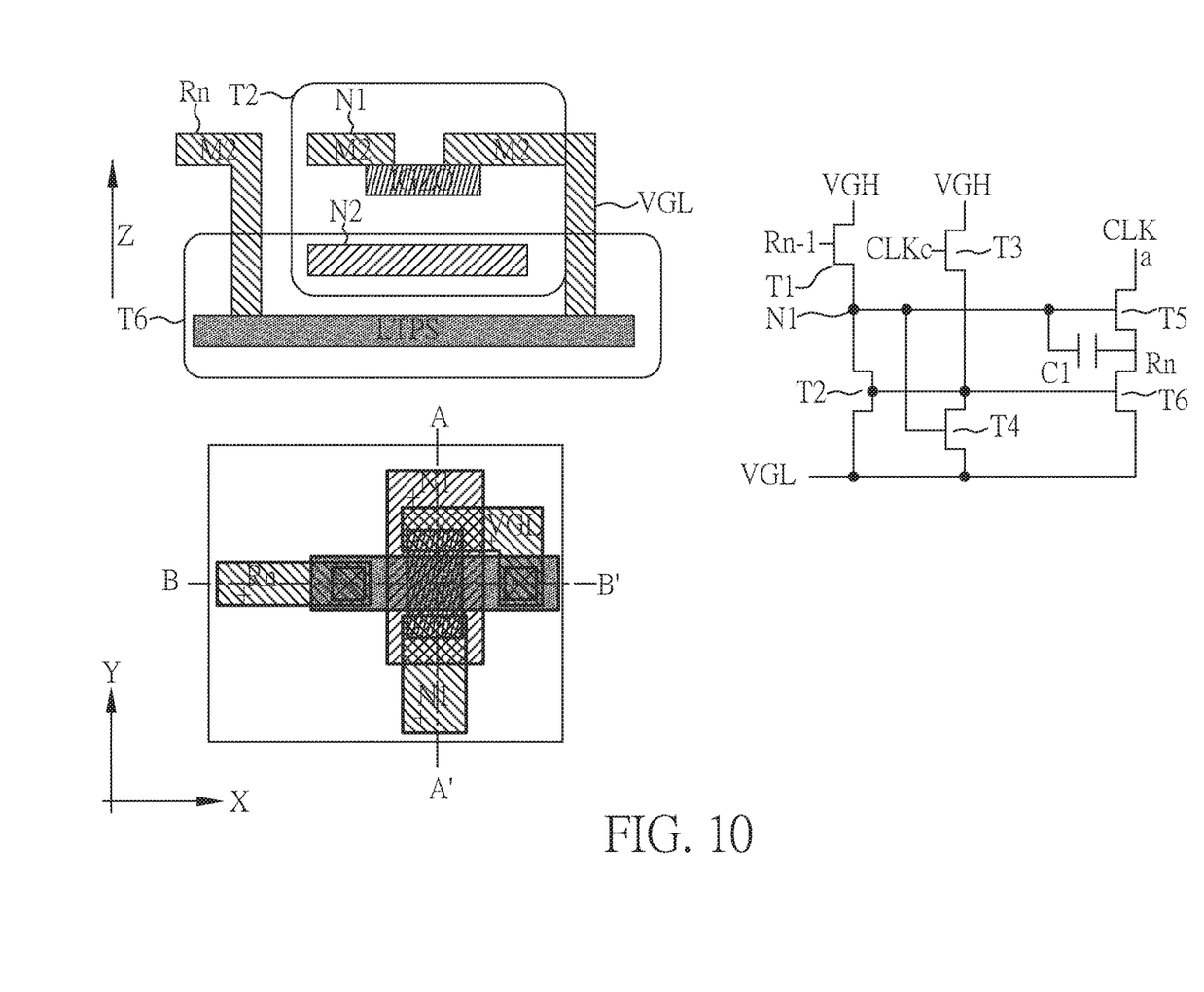
FIG. 10 is a circuit layout of FIG. 1 of the present disclosure.

FIG. 10 is a circuit layout of FIG. 1 according to the present disclosure. It shows the circuit layout of the second transistor (T2) and the sixth transistor (T6) in FIG. 1, wherein the second transistor (T2) is an oxide semiconductor transistor, and the sixth transistor (T6) is a polysilicon transistor. The upper left side of FIG. 10, where T2 represents the second transistor (T2), is the cross-sectional view of the portion taking along the AA' line in the lower-left side of FIG. 10. The upper-left side of FIG. 10, where T6 represents the sixth transistor (T6), is the cross-sectional view of the portion taking along the BB' line in the lower-left side of FIG. 10. As shown in FIG. 10, the second transistor (T2) is of a bottom gate structure, and the sixth transistor (T6) is of a top gate structure. The second transistor (T2) and the sixth transistor (T6) commonly share a gate. As shown in FIG. 10, the second transistor (T2) and the sixth transistor (T6) commonly share a gate (Gate(M1)). Therefore, for circuit layout, the stack-up structure of the second transistor (T2) and the sixth transistor (T6) can effectively save the area of circuit layout.

Figure 11:
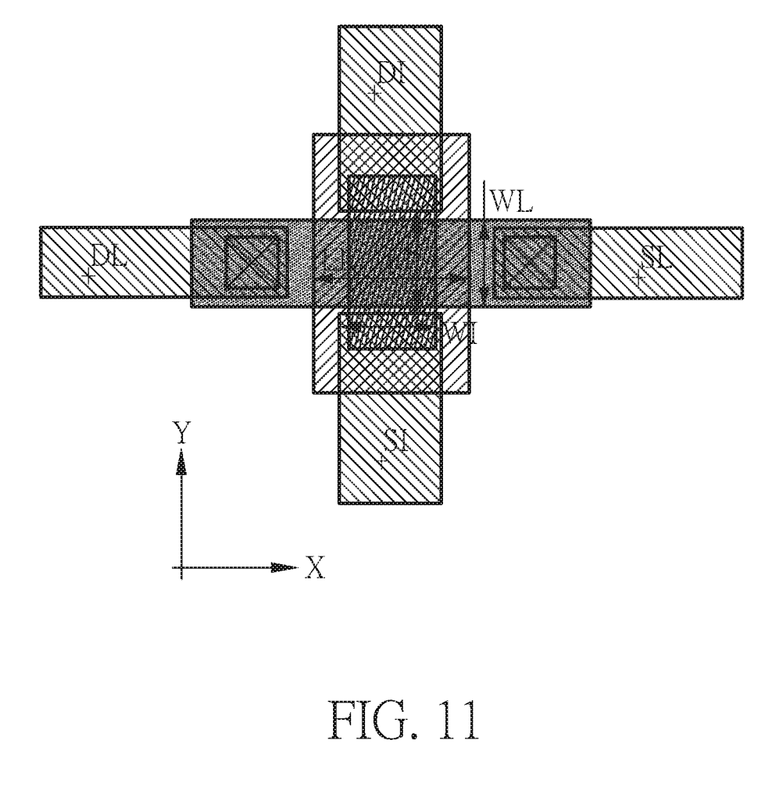
FIG. 11 is another circuit layout of FIG. 1 of the present disclosure.

FIG. 11 is another circuit layout of FIG. 1 according to the present disclosure. It shows another circuit layout of the second transistor (T2) and the sixth transistor (T6) in FIG. 1, wherein DI is the drain of the oxide semiconductor transistor or the second transistor (T2), SI is the source of the oxide semiconductor transistor or the second transistor (T2), DL is the drain of the polysilicon transistor or the sixth transistor (T6), SL is the source of the polysilicon transistor or the sixth transistor (T6), WI is the channel width of the oxide semiconductor transistor or the second transistor (T2), LI is the channel length of the oxide semiconductor transistor or the second transistor (T2), WL is the channel width of the polysilicon transistor or the sixth transistor (T6), and LL is the channel length of the polysilicon transistor or the sixth transistor (T6).

Figure 12:
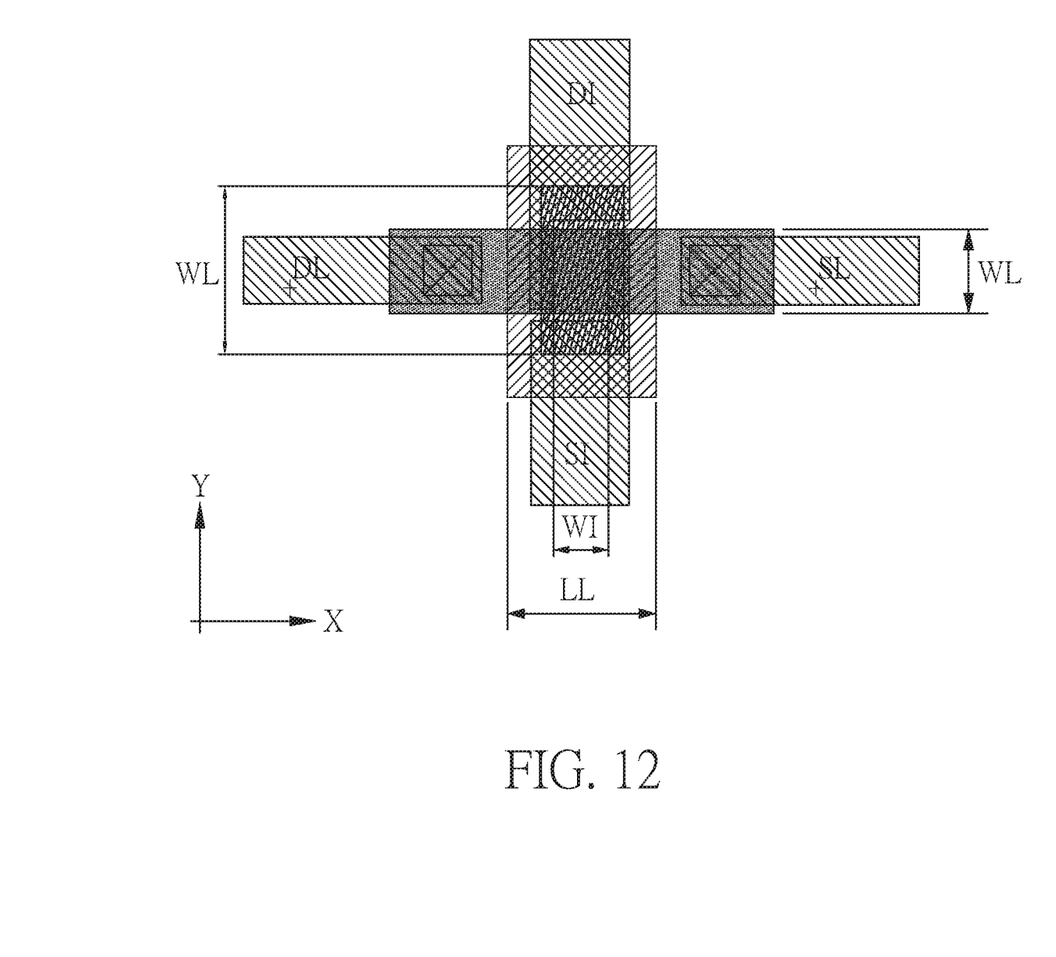
FIG. 12 is still another circuit layout of FIG. 1 of the present disclosure.

FIG. 12 is still another circuit layout of FIG. 1 according to the present disclosure. It shows still another circuit layout of the second transistor (T2) and the sixth transistor (T6) in FIG. 1, wherein DI, SI, DL, SL, WI, LI, WL, and LL have the same meanings as in FIG. 11. It is noted that, in FIG. 12, the channel of the oxide semiconductor transistor or the second transistor (T2) and the channel of the polysilicon transistor or the sixth transistor (T6) are arranged in the same direction. Therefore, it is able to adjust the width to length ratio (W/L) of oxide semiconductor transistor or the second transistor (T2) without disturbing the circuit layout of the polysilicon transistor or the sixth transistor (T6).

With the aforementioned explanation, the pull-up transistor (T5) in the output circuit 110 is chosen to be a polysilicon transistor. When being turned on, a polysilicon transistor can provide larger current and has larger driving capability to drive the gate line (Rn). Moreover, in the control circuit 120, if there is a transistor connected to the first control node (N1), the transistor is chosen to be an oxide semiconductor transistor for providing a lower leakage current, so as to eliminate the voltage variation at the control end (c) of the pull-up transistor (T5), thereby enabling the pull-up transistor (T5) to provide a stable driving current to the gate line (Rn), and thus mitigating the problem of signal decay in the a distance transmission in prior art.

In addition, the stack-up structure of the transistors with commonly-shared gate of the present disclosure can effectively save the area of circuit layout. Moreover, the channels of the transistor with commonly-shared gate are arranged in the same direction. Therefore, it is able to adjust the width to length ratio (W/L) of a transistor, without disturbing the circuit layout of another transistor, thereby improving the convenience for circuit layout.

The aforementioned embodiments are examples only for explanation. The present disclosure is not limited to the aforementioned embodiments, and is to be accorded the claims.

What is claimed is:

1. A driver circuit, comprising:
an output circuit comprising a pull-up transistor, and the pull-up transistor comprising a silicon semiconductor layer; and
a control circuit coupled to the output circuit, the control circuit comprising a first transistor, and the first transistor comprising an oxide semiconductor layer;
wherein the pull-up transistor has a first control node, and the pull-up transistor is coupled to a first clock signal and a gate line;
wherein the output circuit further comprises an auxiliary transistor coupled to the pull-up transistor and a low voltage, and the auxiliary transistor has a second control node;
wherein the control circuit further comprises a second transistor, a third transistor, a fourth transistor, a fifth transistor, a sixth transistor and a seventh transistor;
wherein the pull-up transistor is further coupled to the seventh transistor;
wherein the auxiliary transistor is further coupled to the second transistor, the third transistor and the fourth transistor;
wherein the first transistor is coupled to the high voltage;
wherein the second transistor is coupled to the low voltage, the first control node, the first transistor and the seventh transistor;
wherein the third transistor is coupled to a second control signal and the high voltage;
wherein the fourth transistor is coupled to the low voltage, the first transistor, the fifth transistor and the sixth transistor;
wherein the fifth transistor is coupled to a third control signal and a previous gate line;
wherein the sixth transistor is coupled to a fourth control signal and a next gate line;
wherein each of the pull-up transistor, the auxiliary transistor, the first transistor, the second transistor, the third transistor, the fourth transistor, the fifth transistor, the sixth transistor and the seventh transistor has a first end, a second end and a third end.

2. The driver circuit as claimed in claim 1, wherein the first end of the pull-up transistor is connected to the first clock signal; the second end of the pull-up transistor is connected to the gate line and the first end of the auxiliary transistor; the third end of the pull-up transistor is connected to the first end of the seventh transistor;
wherein the second end of the auxiliary transistor is connected to the low voltage; and the third end of the auxiliary transistor is connected to the second control node, the second end of the third transistor, the third end of the second transistor and the first end of the fourth transistor;
wherein the first end of the third transistor is connected to the high voltage, and the third end of the third transistor is connected to the second control signal;
wherein the second end of the fourth transistor is connected to the low voltage; the third end of the fourth transistor is connected to the second end of the fifth transistor, the second end of the sixth transistor and the third end of the first transistor;
wherein the first end of the fifth transistor is connected to the previous gate line; and the third end of the fifth transistor is connected to the third control signal;
wherein the first end of the sixth transistor is connected to the next gate line, and the third end of the sixth transistor is connected to the fourth control signal.

3. The driver circuit as claimed in claim 1, wherein at least one of the second transistor and the fourth transistor comprises an oxide semiconductor layer.

4. The driver circuit as claimed in claim 1, wherein the control circuit further comprises a capacitor between the second end and the third end of the pull-up transistor.

5. The driver circuit as claimed in claim 1, wherein the first end of the seventh transistor is connected to the third end of the pull-up transistor, the second end of the seventh transistor is connected to the second end of the first transistor, and the third end of the seventh transistor is connected to the high voltage.

6. The driver circuit as claimed in claim 1, wherein the control circuit further comprises an eighth transistor having a first end connected to the third end of the auxiliary transistor, a second end connected to the low voltage, and a third end connected to the second end of the pull-up transistor.

7. The driver circuit as claimed in claim 1, wherein the control circuit further comprises a ninth transistor having a first end connected to a reset signal, a second end connected to the third end of the auxiliary transistor, and a third end connected to the reset signal.

8. The driver circuit as claimed in claim 1, wherein the second transistor and the sixth transistor have a stack-up structure of a commonly-shared gate.

9. A driver circuit, comprising:
an output circuit comprising a pull-up transistor, and the pull-up transistor comprising a silicon semiconductor layer; and
a control circuit coupled to the output circuit, the control circuit comprising a first transistor, and the first transistor comprising an oxide semiconductor layer;
wherein the pull-up transistor has a first control node, and the pull-up transistor is coupled to a first clock signal and a gate line;
wherein the output circuit further comprises an auxiliary transistor coupled to the pull-up transistor and a low voltage, and the auxiliary transistor has a second control node;
wherein the control circuit further comprises a second transistor, a third transistor, and a fourth transistor;
wherein the first transistor is coupled to the first control node;
wherein the second transistor is coupled to the first control node, the low voltage, and the second control node;
wherein the third transistor is coupled to a high voltage and the second control node;
wherein the fourth transistor is coupled to the second control node and the low voltage;
wherein at least one of the second transistor, the third transistor and the fourth transistor comprises an oxide semiconductor layer;
wherein the control circuit further comprises a fifth transistor, a sixth transistor, a seventh transistor, an eighth transistor, a ninth transistor and a tenth transistor;
wherein the pull-up transistor is further coupled to the first transistor,
wherein the auxiliary transistor is further coupled to the third transistor, the second transistor, the fourth transistor, the fifth transistor and the sixth transistor;
wherein the first transistor is coupled to the high voltage;
wherein the third transistor is coupled to the high voltage, the eighth transistor and the tenth transistor;
wherein the fourth transistor is coupled to the low voltage, the first control node, the first transistor, the second transistor, the seventh transistor and the ninth transistor;
wherein the sixth transistor is coupled to the low voltage, the fifth transistor and a first control signal line;
wherein the seventh transistor is coupled to a first input signal line, a second control signal line and the eighth transistor;
wherein the ninth transistor is coupled to a second input signal, a third control signal and the tenth transistor, the eighth transistor being coupled to a fourth control signal; and
wherein the tenth transistor is coupled to a fifth control signal;
wherein each of the pull-up transistor, the auxiliary transistor, the first transistor, the second transistor, the third transistor, the fourth transistor, the fifth transistor, the sixth transistor, the seventh transistor, the eighth transistor and the ninth transistor has a first end, a second end and a third end.

10. The driver circuit as claimed in claim 9, wherein the first end of the pull-up transistor is connected to the first clock signal; the second end of the pull-up transistor is connected to the gate line and the first end of the auxiliary transistor; and the third end of the pull-up transistor is connected to the first end of the first transistor;
wherein the second end of the auxiliary transistor is connected to the low voltage; the third end of the auxiliary transistor is connected to the second control node, the second end of the third transistor, the third end of the second transistor, the first end of the fourth transistor;
wherein the first end of the third transistor is connected to the high voltage; and the third end of the third transistor is connected to the second end of the eighth transistor and the second end of the tenth transistor;
wherein the second end of the fourth transistor is connected to the low voltage; and the third end of the fourth transistor is connected to the first control node, the second end of the first transistor, the first end of the second transistor, the first end of the seventh transistor, and the first end of the ninth transistor;
wherein the third end of the seventh transistor is connected to the first input signal line; and the second end of the seventh transistor is connected to the second control signal line and the third end of the eighth transistor;
wherein the first end of the eighth transistor is connected to the fourth control signal;
wherein the third end of the ninth transistor is connected to the second input signal; and the second end of the ninth transistor is connected to the third control signal and the third end of the tenth transistor;
wherein the first end of the tenth transistor is connected to the fifth control signal.

11. The driver circuit as claimed in claim 10, wherein the control circuit further comprises a first capacitor between the third end of the fourth transistor, and a second capacitor between the third end of the auxiliary transistor and the low voltage.

12. The driver circuit as claimed in claim 9, wherein at least one of the seventh transistor and the ninth transistor comprises an oxide semiconductor layer.

* * * * *